United States Patent
Ho et al.

(10) Patent No.: US 6,995,094 B2
(45) Date of Patent: Feb. 7, 2006

(54) METHOD FOR DEEP TRENCH ETCHING THROUGH A BURIED INSULATOR LAYER

(75) Inventors: Herbert L. Ho, New Windsor, NY (US); Mahender Kumar, Fishkill, NY (US); Brian Messenger, Newburgh, NY (US); Michael D. Steigerwalt, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 10/605,607

(22) Filed: Oct. 13, 2003

(65) Prior Publication Data

US 2005/0079724 A1    Apr. 14, 2005

(51) Int. Cl.
 *H01L 21/302*    (2006.01)

(52) U.S. Cl. .............. 438/710; 438/717; 438/719; 438/723; 438/724; 438/735; 438/736; 438/738; 438/743; 216/47; 216/51; 216/74; 216/79; 216/80

(58) Field of Classification Search .......... 216/47, 216/51, 67, 74, 79, 80; 438/710, 717, 719, 438/723, 724, 735–738, 743
See application file for complete search history.

(56) References Cited

U.S. PATENT DOCUMENTS

| | | | |
|---|---|---|---|
| 5,770,484 A * | 6/1998 | Kleinhenz | 438/155 |
| 5,914,280 A | 6/1999 | Gelzinis | |
| 6,472,702 B1 * | 10/2002 | Shen | 257/301 |
| 6,479,394 B1 | 11/2002 | Choutov et al. | |
| 6,518,192 B2 | 2/2003 | Khan et al. | |
| 2001/0001719 A1 | 5/2001 | Hakey et al. | |
| 2002/0192969 A1 | 12/2002 | Losee | |
| 2004/0147074 A1 * | 7/2004 | Sell et al. | 438/243 |

OTHER PUBLICATIONS

Rossnagel et al., Handbook of Plasma Processing, 1990, Noyes Publications, p. 198.*
Wolf, Silicon Processing for the VLSI Era, 2002, Lattice Press, vol. 4, pp. 535-536.*
Wolf et al., Silicon Processing for the VlSI Era, 1986, Lattice Press, vol. 1, pp. 523-524.*

* cited by examiner

*Primary Examiner*—Nadine G. Norton
*Assistant Examiner*—Eric B. Chen
(74) *Attorney, Agent, or Firm*—James J. Cioffi; Cantor Colburn LLP

(57) ABSTRACT

A method for etching a silicon on insulator (SOI) substrate includes opening a hardmask layer formed on an SOI layer, and etching through the SOI layer, a buried insulator layer underneath the SOI layer, and a bulk silicon layer beneath the buried insulator layer using a single etch step.

16 Claims, 3 Drawing Sheets

METHOD FOR DEEP TRENCH ETCHING THROUGH A BURIED INSULATOR LAYER

BACKGROUND OF INVENTION

The present invention relates generally to semiconductor device processing and, more particularly, to a method for deep trenching etching of a silicon wafer through a buried insulator layer.

Dynamic random access memory, or DRAM, is a type of semiconductor memory in which the information is stored as data bits in capacitors on a metal-oxide-semiconductor (MOS) integrated circuit. Each bit is typically stored as an amount of electrical charge in a storage cell consisting of a capacitor and a transistor. Due to charge leakage, the capacitor discharges gradually and the memory cell can lose the information. Therefore, to preserve the information, the memory must be refreshed periodically. Despite this inconvenience, the DRAM is a very popular memory technology because of its high density and consequent low price.

Conventional semiconductor DRAM devices are formed in bulk semiconductive substrate material by implanting a well of either p-type or n-type material in a wafer of either type material. Gates and source/drain diffusions are then manufactured using commonly known processes. These can form devices known as metal-oxide-semiconductor field effect transistors, or MOSFETs. When a given chip uses both p-type and n-type semiconductors, it is known as a complementary metal oxide semiconductor (CMOS) chip. Each of these type devices must be electrically isolated from the others in order to avoid electrical shorting of the circuits. A relatively large amount of surface area is needed for the electrical isolation of the various FETs, which is undesirable in the current trend toward overall size reduction and greater integration. Additionally, parasitic paths and junction capacitance problems may be present because of the physical proximity of the source/drain diffusions to other FETs and to the bulk substrate. These problems more frequently arise when trying to scale circuitry down to the sizes necessary for greater circuit density.

Silicon-on-insulator (SOI) technology is one approach that has been increasingly used to alleviate these problems. However, SOI devices may suffer from problems such as self-heating, electrostatic discharge susceptibility, low breakdown voltage, and dynamic floating body effects, which in turn present problems for passgate devices and devices requiring tight threshold voltage control. The so-called "floating body effect" occurs when the body of the device is not connected to a fixed potential and, therefore, the device takes on a charge based on the history of the device. The floating body effect greatly affects device reliability.

Certain types of semiconductor memory are more susceptible to the floating body effect. For instance, in dynamic random access memory (DRAM) the information is stored in capacitors in an MOS circuit. Thus, in DRAM, the floating body effect is especially detrimental since it is critical that the associated transistor stays in an "off" condition to prevent charge leakage from the storage capacitor. As such, it is generally advantageous to form a DRAM array in bulk silicon regions, and advantageous to form other logic devices in an SOI region. In the case of an embedded DRAM (eDRAM) device, such as is found in the area of Application Specific Integrated Circuit (ASIC) technologies for example, the memory array region of the device is generally formed in proximity to the support regions of the device. As result, eDRAM devices have recently been formed within a designed bulk/SOI hybrid substrate, wherein the DRAM devices are formed in the bulk regions of the hybrid substrate and the support devices are formed in the SOI regions of the hybrid substrate.

For such configurations, one existing approach has been to pattern and create both bulk and SOI regions on the same wafer by processes such as separation by implantation of oxygen (SIMOX), for example. However, the additional lithography, patterning and implantation steps associated therewith increase the overall manufacturing costs of the device. Accordingly, it would be desirable to be able to form both support and array areas of an eDRAM device on a uniform substrate (such as an SOI substrate), while still retaining the benefits of a hybrid substrate in terms of device performance.

SUMMARY OF INVENTION

The foregoing discussed drawbacks and deficiencies of the prior art are overcome or alleviated by a method for etching a silicon on insulator (SOI) substrate. In an exemplary embodiment, the method includes opening a hardmask layer formed on an SOI layer of the SOI substrate, and etching through the SOI layer, a buried insulator layer underneath the SOI layer, and a bulk silicon layer beneath the buried insulator layer using a single etch step.

In another aspect, a method for forming a deep trench within a silicon on insulator (SOI) substrate. In an exemplary embodiment, the method includes forming a hardmask layer on an SOI layer of the SOI substrate, patterning a desired deep trench pattern in the hardmask layer, and etching through the SOI layer, a buried oxide (BOX) layer underneath the SOI layer, and a bulk silicon layer beneath the BOX layer using a single etch step.

BRIEF DESCRIPTION OF DRAWINGS

Referring to the exemplary drawings wherein like elements are numbered alike in the several Figures.

DETAILED DESCRIPTION

The etching of a deep trench in silicon has been the foundation for building capacitors on eDRAM dram and DRAM circuits. With an oxide hardmask in place, a high aspect ratio trench may be etched into bulk crystal silicon. Existing trench processes have not heretofore been specifically designed or utilized to etch through any materials other than silicon. As such, the silicon to oxide selectivity has been imperative to the trench etch process in order to preserve the oxide hardmasks.

With the merging of eDRAM with silicon on insulator (SOI) technology comes a new requirement to etch through a buried oxide to create the deep trench. Today, patterning of the buried oxide layer is carried out so as to eliminate the necessity of using multiple etching steps in order to complete the deep trench through the buried oxide. Unfortunately, the creation of patterned silicon on insulators requires extra processing steps and extra reticles.

It has been discovered that a particular deep trench process has the ability to etch through buried oxides and continue etching into bulk silicon to create a deep trench with clean profiles and acceptable depth. This capability eliminates the need for creating patterned buried oxides. Moreover, this particular etching process utilizes only a single process step in one chamber to etch through a three-film stack (e.g., silicon, oxide, silicon). As is described in further detail hereinafter, an embodiment of the present invention utilizes an HBr, $NF_3$, $O_2$ chemistry at sufficient high power so as to etch a deep trench through silicon on insulator, a relatively thick buried oxide (BOX) layer (e.g., about 130–140 nm), and thereafter through bulk silicon in a single processing step in a RIE process chamber set up for silicon deep trench etching.

Figure 1:
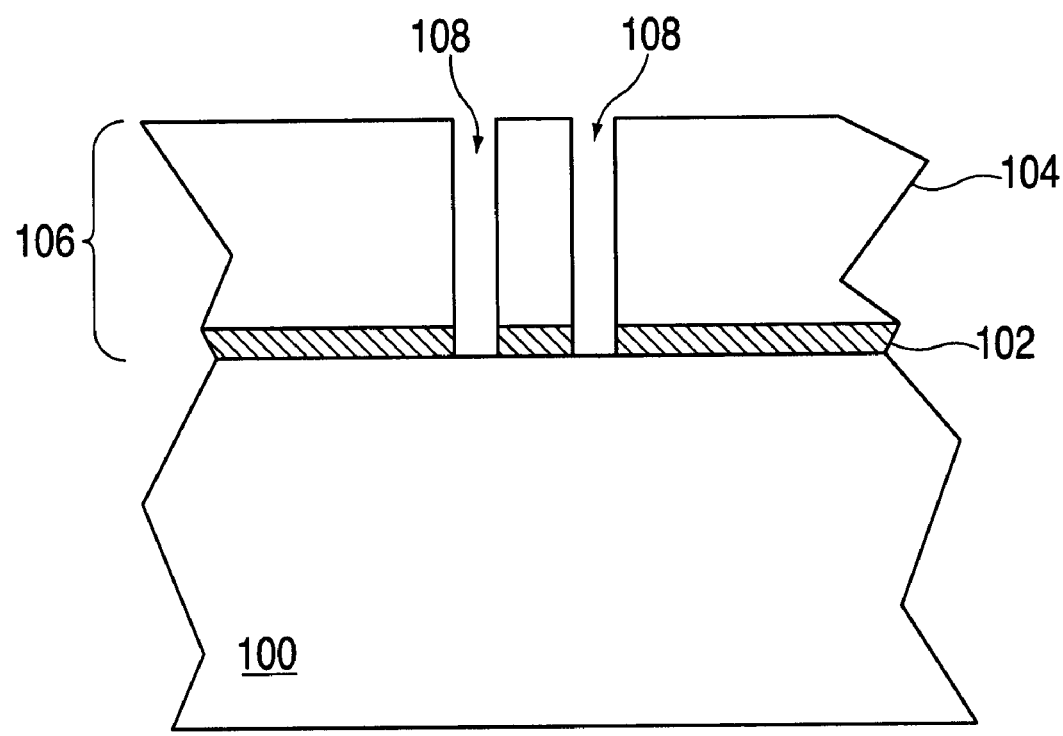
FIGS. 1 and 2 illustrate cross sectional views of a conventional trench etching process implemented in a bulk silicon substrate.

Referring initially to FIG. 1, there is shown a cross sectional view of a bulk silicon substrate 100 in which a conventional deep trench formation process is implemented. As is known in the art, a deep trench silicon etch is a process in which trenches are etched (e.g., by reactive ion etching) into crystal silicon at high aspect ratios. As used herein, the term "aspect ratio" refers to the ratio of the trench depth with respect to the opening at the top of the trench. Thus, a "high" aspect ratio in the context of deep trench etching is generally considered to be on the order of about 30:1 or more. In order to prepare the substrate 100 for the deep trench process, a thin pad nitride hardmask 102 and a thick borosilicate glass (BSG) oxide hardmask 104 is deposited thereon. The wafer is patterned by appropriate lithography steps, and the resulting hardmask stack (collectively denoted by 106) is patterned by a mask opening etch that defines the openings 108 for deep trench formation.

Figure 2:
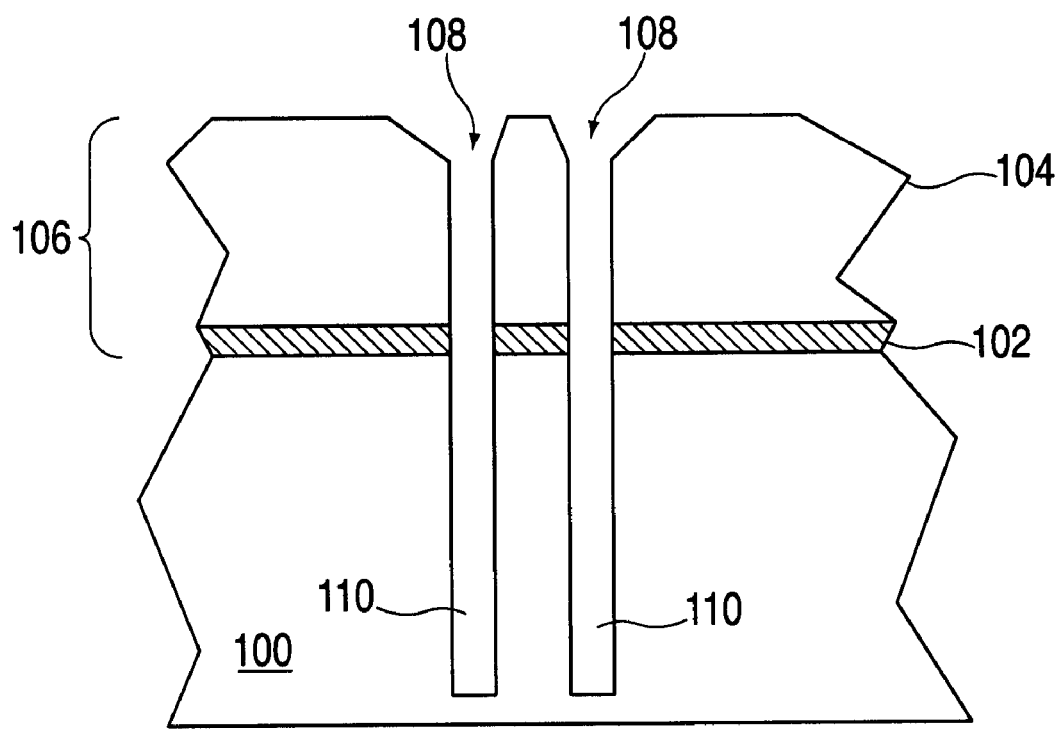

The trench etch process is then completed by etching one or more deep vertical trenches 110 into the bulk crystal silicon substrate 100, as shown in FIG. 2. It will be recognized that the trenches 110 shown in FIG. 2 are not illustrated to scale, as a typical deep trench for a DRAM storage cell may be on the order of about 6,000 to 10,000 nm (6–10 microns) deep, for example. In order to maintain the desired aspect ratio at least about or above 30:1, a relatively thick oxide hardmask is used (e.g., about 6,000 to about 20,000 Angstroms (Å) and more particularly, for deep trench applications, about 10,000 to about 18,000 Å). Accordingly, the etch rate for silicon has to be highly selective to this oxide mask, typically at an aspect ratio of above 5:1. In turn, in order to maintain these etch high selectivities, gas chemistries are chosen which do not etch oxide well.

As discussed earlier, the role of merged logic devices (such as eDRAM having both logic and support devices on a common substrate) has become increasingly significant in semiconductor device manufacturing. Moreover, for high performance devices there is a trend in switching from using conventional bulk semiconductor wafers to SOI wafers. Instead of implementing more complex patterning steps to selectively place SOI areas on a wafer, the present invention embodiments allow for the formation of deep trenches in areas where SOI is present, but without multiple etching steps to account for the buried oxide layer (BOX). In other words, forming the deep trench without an SOI etch (selective to BOX), followed by an oxide etch selective to silicon, followed by yet another bulk silicon etch that is selective to oxide.

Figure 3:
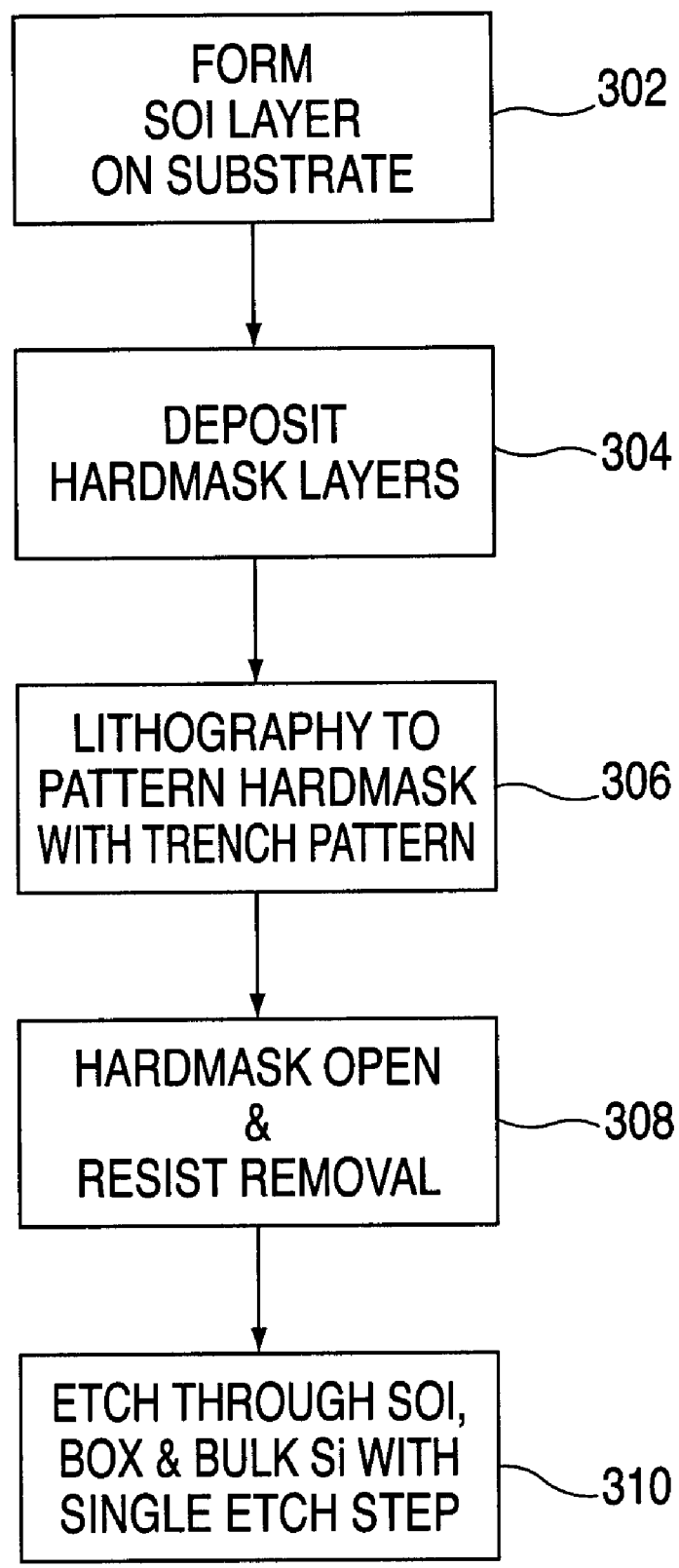
FIG. 3 is a process flow diagram illustrating a method for deep trenching etching through a buried insulator layer, in accordance with an embodiment of the invention.

FIG. 3 is a process flow diagram illustrating a method 300 for deep trenching etching through a buried insulator layer, in accordance with an embodiment of the invention. As shown in block 302, a semiconductor wafer is provided with a silicon on insulator layer over a buried oxide layer on a bulk silicon substrate. The SOI wafer may be formed by any of a number of existing techniques known in the art such as SIMOX or "smart cut", for example. In addition, the entire wafer may have an SOI layer, or the wafer may be patterned with specific regions of SOI, depending on the desired application(s) thereof. Once the SOI wafer is formed, one or more layers of hardmask material are formed over the SOI layer, as shown at block 304.

Then, at block 306, the resulting hardmask stack is patterned with the desired deep trench pattern through appropriate lithography steps. In block 308, the hardmask stack is opened and the photoresist material is removed and the wafer cleaned. Finally, at block 310, a single etch step is used to etch through the SOI layer, the BOX layer and the bulk silicon to the desired trench depth, while maintaining sufficient trench structural integrity.

Figure 4:
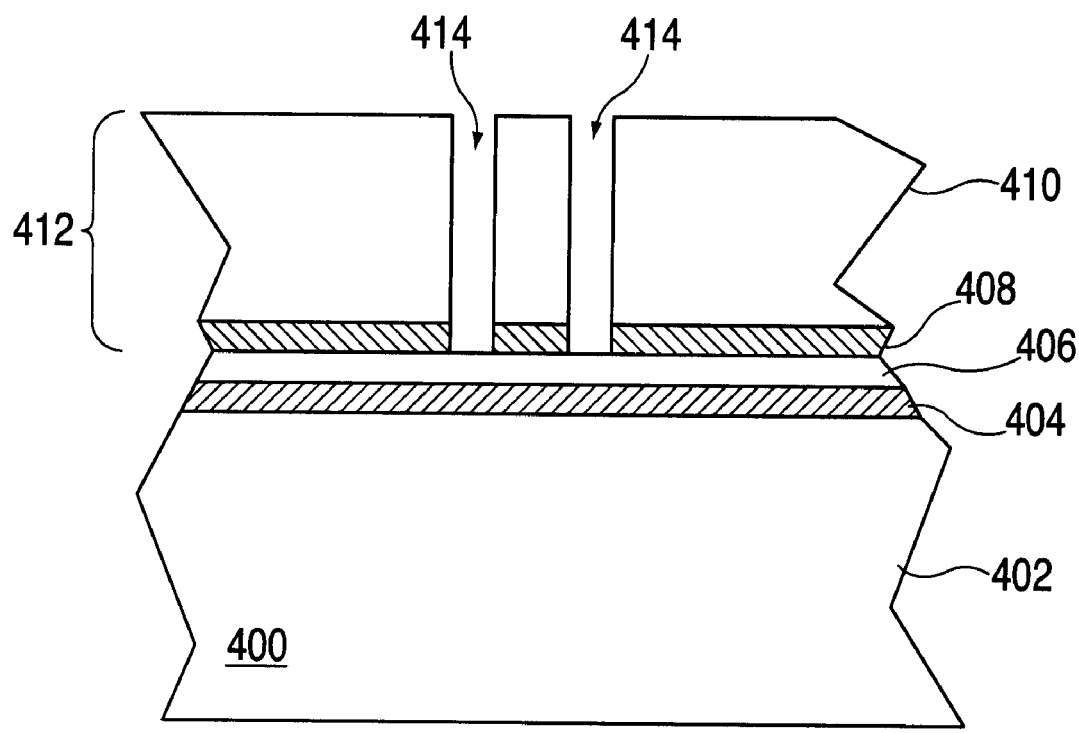
FIGS. 4 and 5 illustrate cross sectional views of the etching process of FIG. 3.
Figure 5:
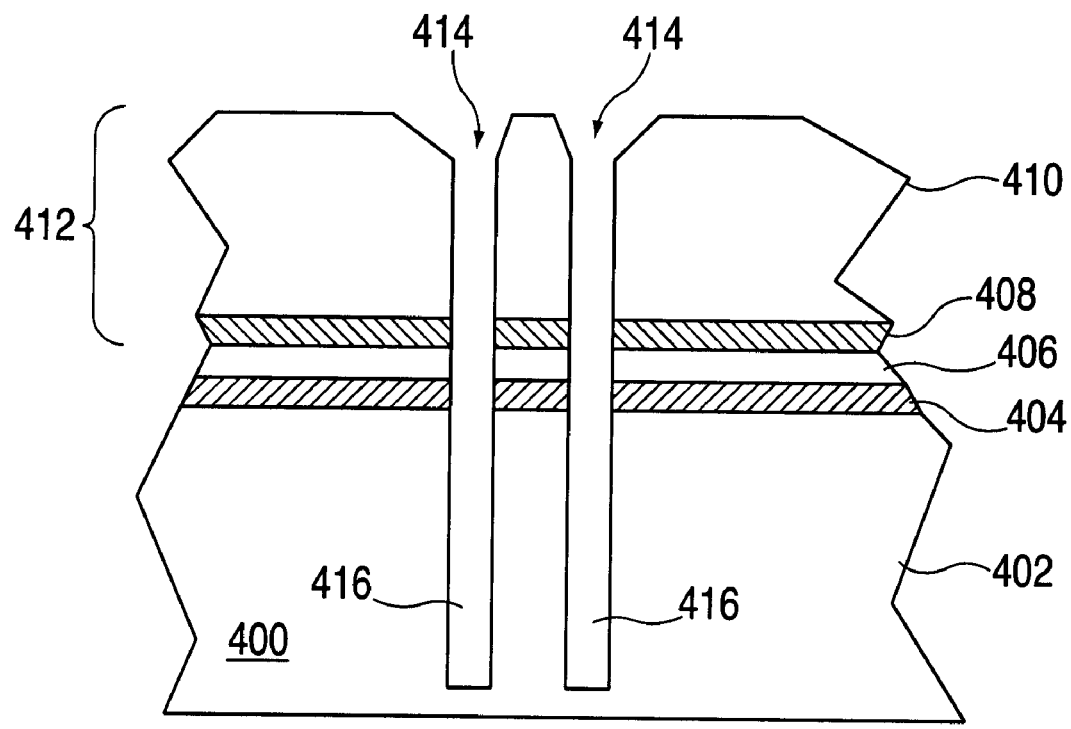

FIGS. 4 and 5 illustrate cross sectional views of the etching process 300 of FIG. 3. As can be seen in FIG. 4, the SOI substrate 400 includes a bulk silicon region 402, BOX layer 404, and SOI layer 406. Formed thereupon are a thin pad nitride hardmask 408 and a thick borosilicate glass (BSG) oxide hard mask 410. The resulting hardmask stack (collectively denoted by 412) is patterned by a mask opening etch that defines the openings 414 for deep trench formation. The single etch step deep trenches 416 are shown in FIG. 5.

In order to achieve the single step etch, a low-pressure taper process was used (e.g., about 10 to about 150 mTorr). The taper refers to the component of the etch process that etches through the SOI, and was added to the recipe to add stability to the bulk etch trench process. In particular, the low-pressure process further adds a high sputtering component to the etch, thereby making it successful at cutting through oxide despite its selective chemistry makeup. In an exemplary embodiment, the above-described trench etch process uses an HBr, $NF_3$, $O_2$ chemistry at relatively high power levels (e.g., about 500–1000 Watts). This chemistry etches through both silicon and oxide and maintains structural integrity during the rest of the trench-etch process after etching through the SOI layer. Moreover, the process has had demonstrated repeatability with multiple, non-patterned SOI wafer lots.

As will be appreciated, the above described process may be used for other applications where a single etch chemistry is desired to etch both silicon and a dielectric, so long as the dielectric thickness is sufficiently low compared to the hardmask thickness. For example, the hardmask thickness should account for approximately a 1:1 selectivity while etching dielectrics, and a selectivity from about 5:1 to about 35:1 for etching silicon.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for etching a silicon on insulator (SOI) substrate, the method comprising:
   opening a hardmask layer formed on an SOI layer of the SOI substrate; and etching through said SOI layer, a buried insulator layer underneath said SOI layer, and a bulk silicon layer beneath said buried insulator layer using a single etch step, wherein said single etch step is sufficient to etch through said bulk silicon layer to a depth corresponding to a deep trench depth, wherein said etching is implemented with an HBR, $NF_3$ and $O_2$ etch chemistry.

2. The method of claim 1, wherein said etch chemistry is applied at a power of about 500 to about 1000 Watts.

3. The method of claim 1, wherein said etching is implemented at a pressure of about 10 to about 150 mTorr.

4. The method of claim 1, wherein said hardmask layer is formed at a thickness so as to accommodate a 1:1 etch selectivity with respect to said buried insulator layer and about a 5:1 to about a 35:1 etch selectivity with respect to said SOI layer and said bulk silicon layer.

5. The method of claim 4, wherein said hardmask layer further comprises:
   a pad nitride layer formed on said SOI layer; and
   a borosilicate glass (BSG) oxide layer formed on said pad nitride layer.

6. The method of claim 5, wherein said hardmask layer is formed at a thickness of about 6,000 Angstroms to about 20,000 Angstroms.

7. The method of claim 5, wherein said hardmask layer is formed at a thickness of about 10,000 Angstroms to about 18,000 Angstroms.

8. The method of claim 4, wherein said buried insulator layer comprises a buried oxide (BOX) layer formed at a thickness of about 120 to about 140 nanometers.

9. A method for forming a deep trench within a silicon on insulator (SOI) substrate, the method comprising:
   forming a hardmask layer on an SOI layer of the SOI substrate;
   patterning a desired deep trench pattern in said hardmask layer; and
   etching through said SOI layer, a buried oxide (BOX) layer underneath said SOI layer, and a bulk silicon layer beneath said BOX layer using a single etch step, wherein said single etch step is sufficient to etch through said bulk silicon layer to a depth corresponding to a deep trench depth, wherein said etching is implemented with an HBR, $NF_3$ and $O_2$ etch chemistry.

10. The method of claim 9, wherein said etch chemistry is applied at a power of about 500 to about 1000 Watts.

11. The method of claim 9, wherein said etching is implemented at a pressure of about 10 to about 150 mTorr.

12. The method of claim 9, wherein said hardmask layer is formed at a thickness so as to accommodate a 1:1 etch selectivity with respect to said BOX layer and about a 5:1 to about a 35:1 etch selectivity with respect to said SOI layer and said bulk silicon layer.

13. The method of claim 12, wherein said hardmask layer further comprises:
   a pad nitride layer formed on said SOI layer; and
   a borosilicate glass (BSG) oxide layer formed on said pad nitride layer.

14. The method of claim 13, wherein said hardmask layer is formed at a thickness of about 6,000 Angstroms to about 20,000 Angstroms.

15. The method of claim 13, wherein said hardmask layer is formed at a thickness of about 10,000 Angstroms to about 18,000 Angstroms.

16. The method of claim 11, wherein said buried insulator layer comprises a buried oxide (BOX) layer formed at a thickness of about 120 to about 140 nanometers.

* * * * *